(12) United States Patent
Sugimoto

(10) Patent No.: US 7,299,810 B2
(45) Date of Patent: Nov. 27, 2007

(54) SUBSTRATE TREATING APPARATUS WITH CIRCULATING AND HEATING MECHANISM FOR REMOVAL LIQUID

(75) Inventor: Hiroaki Sugimoto, Kyoto (JP)

(73) Assignee: Dainippon Screen MFG. Co., Ltd. (JP)

( * ) Notice: Subject to any disclaimer, the term of this patent is extended or adjusted under 35 U.S.C. 154(b) by 285 days.

(21) Appl. No.: 10/335,658

(22) Filed: Dec. 30, 2002

(65) Prior Publication Data
US 2003/0176029 A1 Sep. 18, 2003

(30) Foreign Application Priority Data
Mar. 12, 2002 (JP) .............................. 2002-067336

(51) Int. Cl.
*B08B 3/00* (2006.01)

(52) U.S. Cl. ...................... 134/105; 134/137; 134/902

(58) Field of Classification Search ................. 134/1.3, 134/3, 21, 26, 30–33, 105, 137, 102.1, 902; 118/64; 204/198; 396/564; 62/378
See application file for complete search history.

(56) References Cited

U.S. PATENT DOCUMENTS

| | | | |
|---|---|---|---|
| 4,827,867 A * | 5/1989 | Takei et al. ................. 118/64 |
| 5,248,380 A | 9/1993 | Tanaka | |
| 5,861,064 A | 1/1999 | Oikari et al. ................. 134/26 |
| 6,203,625 B1 | 3/2001 | Derie et al. ................. 134/3 |
| 6,242,400 B1 | 6/2001 | Lee ............................ 510/176 |
| 6,247,479 B1 * | 6/2001 | Taniyama et al. ........... 134/95.2 |
| 6,248,179 B1 | 6/2001 | Severac et al. .............. 134/3 |
| 6,334,902 B1 | 1/2002 | Mertens et al. .............. 134/1 |
| 6,358,329 B1 | 3/2002 | Muranaka et al. ........... 134/26 |
| 6,430,840 B1 * | 8/2002 | Jung ........................... 34/468 |
| 2001/0054431 A1 * | 12/2001 | Masui et al. ................ 134/3 |
| 2002/0023458 A1 * | 2/2002 | Sakata et al. ............... 62/378 |
| 2002/0035762 A1 * | 3/2002 | Okuda et al. ............... 15/77 |
| 2002/0043275 A1 * | 4/2002 | Okuda et al. ............... 134/30 |
| 2002/0051644 A1 | 5/2002 | Sugimoto et al. ........... 396/564 |
| 2002/0092542 A1 | 7/2002 | Park et al. .................. 134/1.3 |

FOREIGN PATENT DOCUMENTS

| | | |
|---|---|---|
| JP | 7-14817 | 1/1995 |
| JP | 2001-70861 | 3/2001 |
| WO | WO 00/70667 | 11/2000 |
| WO | WO 01/07177 A1 | 2/2001 |

OTHER PUBLICATIONS

European Search Report issued Mar. 10, 2006.
Japanese Office Action issued Jun. 20, 2006.

* cited by examiner

*Primary Examiner*—Joseph L. Perrin
(74) *Attorney, Agent, or Firm*—Ostrolenk, Faber, Gerb & Soffen, LLP

(57) ABSTRACT

A substrate treating apparatus includes a spin chuck for supporting a substrate to be rotatable in a plane including a principal surface of the substrate, a motor for rotating the spin chuck, a circulating pump for circulating a removal liquid and transmitting the removal liquid to a first nozzle, and a heater for heating the removal liquid in circulation. When removing a reaction product, the spin chuck is rotated at a rotational frequency of at least 100 rpm and not exceeding 3,000 rpm, and the first nozzle supplies the removal liquid at a rate of at least 50 ml per minute to the surface of the substrate supported and rotated by the spin chuck.

17 Claims, 4 Drawing Sheets

SUBSTRATE TREATING APPARATUS WITH CIRCULATING AND HEATING MECHANISM FOR REMOVAL LIQUID

BACKGROUND OF THE INVENTION

1. Field of the Invention

The present invention relates to a substrate treating apparatus and substrate treating method for removing organic substances from substrates. In particular, the invention relates to a substrate treating apparatus and substrate treating method for removing a reaction product, which is an organic substance, from substrates. More particularly, the invention relates to a substrate treating apparatus and substrate treating method for removing, by using a removal liquid, a reaction product generated on surfaces of substrates having a patterned film formed by dry etching using a resist film as a mask.

2. Description of the Related Art

In manufacture of semiconductor devices, an etching process is carried out to make a pattern, by using a resist film as a mask, from a film (e.g. a film of metal such as aluminum, copper or the like) formed on the surface of a substrate, e.g. a semiconductor wafer. For forming a microcircuit pattern in the etching process, dry etching such as RIE (Reactive Ion Etching) is employed.

Reactive ions used in dry etching have such strong power as to resolve the resist film to some extent before the etching of the film is completed. Part of the resist film undergoes a change in property, turns into a reaction product such as a polymer, and deposits on side walls of the film. This reaction product cannot be removed in a resist removing process to follow. It is therefore necessary to remove the reaction product after the resist removing process.

Conventionally, therefore, a reaction product removing process is carried out after the resist removing process, to remove the reaction product from the side walls of the film by supplying the substrate with a removal liquid capable of removing the reaction product.

The above "reaction product resulting from a change in property of the resist" is an organic substance. A process may also be carried out to supply the substrate with an organic substance removal liquid for removing other organic substances from the substrate.

Generally, the removal liquid used in the process of removing such reaction product and other organic substances is the type used at room temperature. Recently, however, a removal liquid has been developed that is used at a temperature higher than room temperature for an enhanced organic substance removing performance. In use, the removal liquid is heated to a proper temperature in the range of 50 to 80° C. to realize a maximum removal rate.

However, even when the removal liquid is heated to the proper temperature, the removal liquid actually supplied to the substrate loses some of its heat to the substrate, thereby to cool below the proper temperature. Thus, even the use of the removal liquid heated to the proper temperature achieves only a low efficiency of removing reaction products, to impair the quality of substrate treatment.

To deal with such a problem, it is conceivable to supply the substrate with the removal liquid heated a temperature above the proper temperature. However, the composition of the removal liquid is sensitive to temperature variations. When the removal liquid is heated above the proper temperature, a change in the composition reduces its ability to remove reaction product.

SUMMARY OF THE INVENTION

The object of the present invention, therefore, is to provide a substrate treating apparatus and substrate treating method for removing organic substances with high efficiency.

The above object is fulfilled, according to the present invention, by a substrate treating apparatus for removing, by using a removal liquid, a reaction product from a surface of a substrate having a film formed on the surface and patterned by dry etching with a resist film acting as a mask, the apparatus comprising a substrate supporting device for supporting the substrate to be rotatable in a plane including a principal surface of the substrate, a driving device for rotating the substrate supporting device at a rotational frequency of at least 100 rpm, a removal liquid supplying device for supplying the removal liquid at a rate of at least 50 ml per minute to the substrate supported and rotated by the substrate supporting device, and a removal liquid heating device for heating the removal liquid to be supplied to the substrate by the removal liquid supplying device.

With this substrate treating apparatus, the phenomenon of the removal liquid cooling from the proper temperature may be restrained over the entire surface of the substrate. Thus, the reaction product may be removed with high removing efficiency.

In a preferred embodiment of the invention, the apparatus further comprises a scatter preventive cup surrounding the substrate supported and rotated by the substrate supporting device, for preventing scattering of the removal liquid, wherein the driving device rotates the substrate at a rotational frequency of at most 3,000 rpm. This construction is effective to avoid lowering of the reaction product removing efficiency and contamination of the substrate due to the removal liquid rebounding from the scatter preventive cup back to the surface of the substrate.

The substrate supported by the substrate supporting device may be the 8-inch type. Then, the removal liquid supplying device supplies the removal liquid at a rate of 150 ml to 500 ml per minute to the substrate supported by the substrate supporting device.

In another preferred embodiment, the substrate supported by the substrate supporting device is the 12-inch type, and the removal liquid supplying device supplies the removal liquid at a rate of 200 ml to 1,000 ml per minute to the substrate supported by the substrate supporting device.

In another aspect of this invention, a substrate treating apparatus is provided for removing an organic substance from a substrate by using a removal liquid capable of removing organic substances, the apparatus comprising a substrate supporting device for supporting the substrate to be rotatable in a plane including a principal surface of the substrate, a driving device for rotating the substrate supporting device at a rotational frequency of at least 100 rpm, a removal liquid supplying device for supplying the removal liquid at a rate of at least 50 ml per minute to the substrate supported and rotated by the substrate supporting device, and a removal liquid heating device for heating the removal liquid to be supplied to the substrate by the removal liquid supplying device.

In a further aspect of the invention, a substrate treating method is provided for removing an organic substance from a substrate by using a removal liquid capable of removing organic substances, the method comprising the steps of rotating the substrate in a plane including a principal surface of the substrate at a rotational frequency of at least 100 rpm, and supplying the removal liquid at a rate of at least 50 ml per minute to the substrate in rotation.

Other features and advantages of the present invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The construction of a substrate treating apparatus according to the invention will be described hereinafter.

This substrate treating apparatus is designed for removing a reaction product, which is an organic substance, from a substrate. In this embodiment, the apparatus removes a polymer as the reaction product from the surface of a substrate, e.g. a silicon semiconductor wafer, with a film formed thereon. The above polymer results from dry etching of the film under a resist film used as a mask.

The resist herein is a photosensitive material, and more particularly a photosensitive material containing an organic substance.

The film noted above is, for example, a film of metal such as copper, aluminum, titanium or tungsten, or a film of a mixture of metals such as copper, aluminum, titanium and tungsten, or an insulating film such as a silicon oxide film, a silicon nitride film, an organic insulating film, a low dielectric layer insulating film or a high dielectric layer insulating film.

Figure 1:
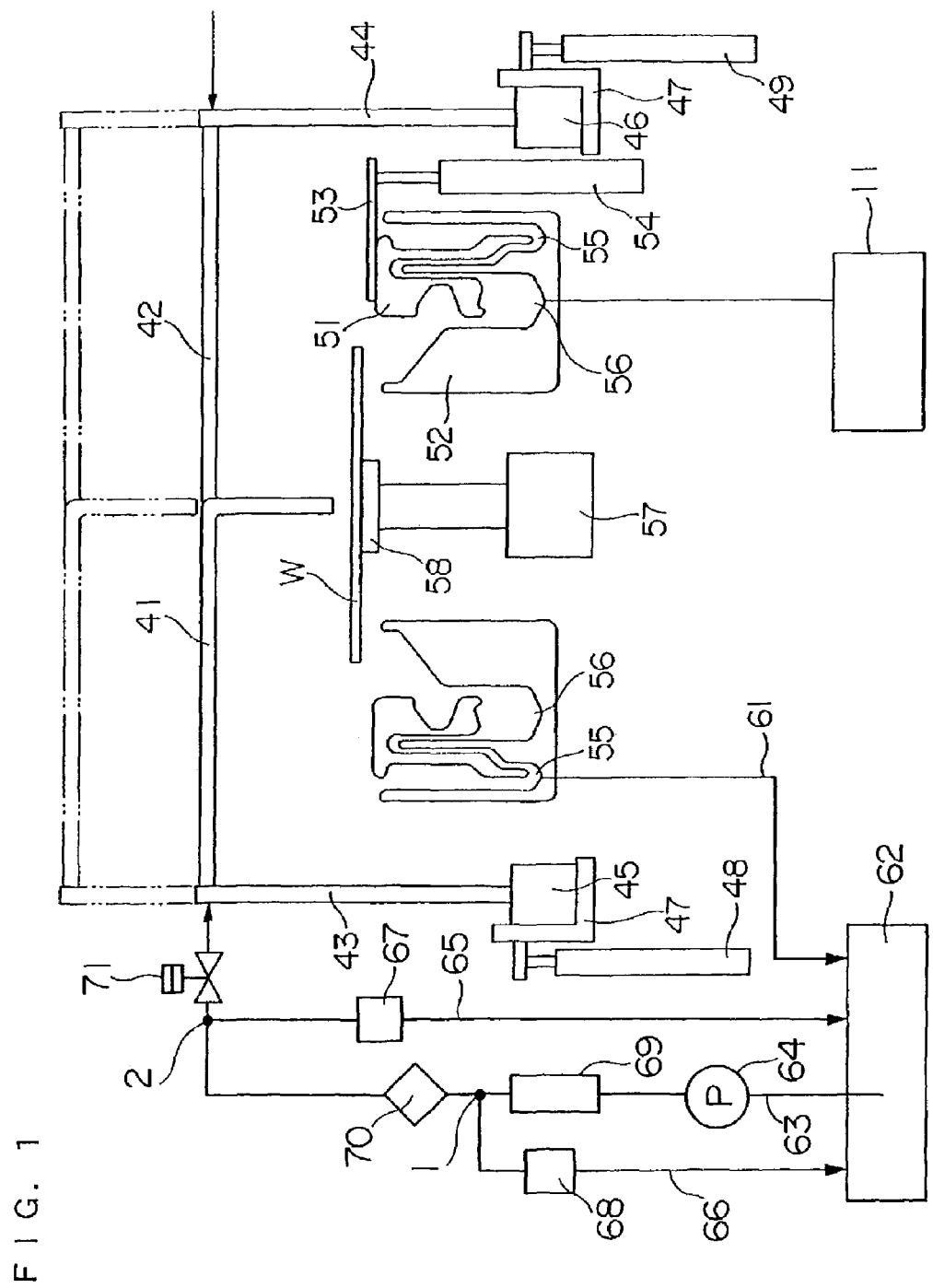
FIG. 1 is a schematic side view of a substrate treating apparatus according to the invention.
Figure 2:
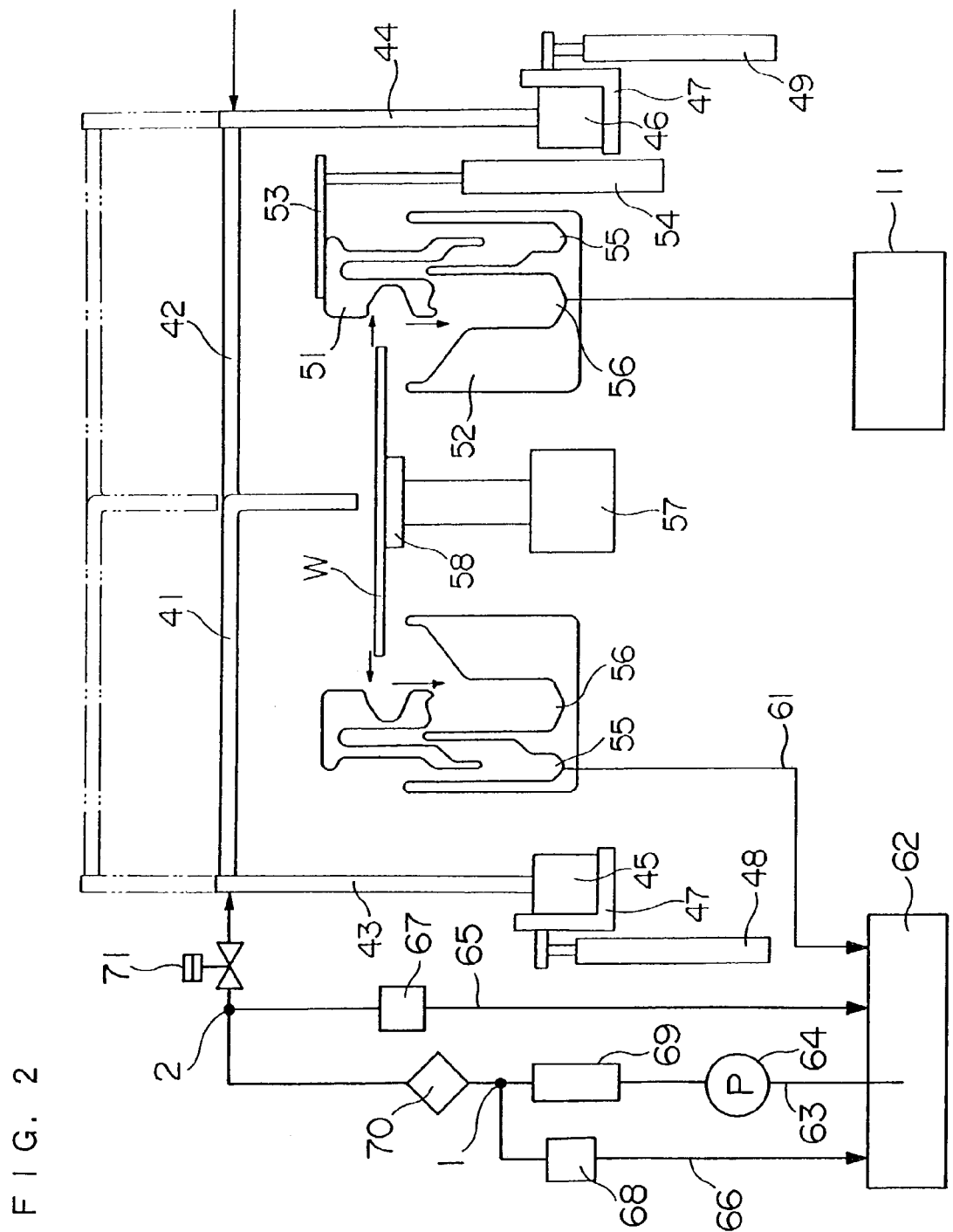
FIG. 2 is another schematic side view of the substrate treating apparatus.
Figure 3:
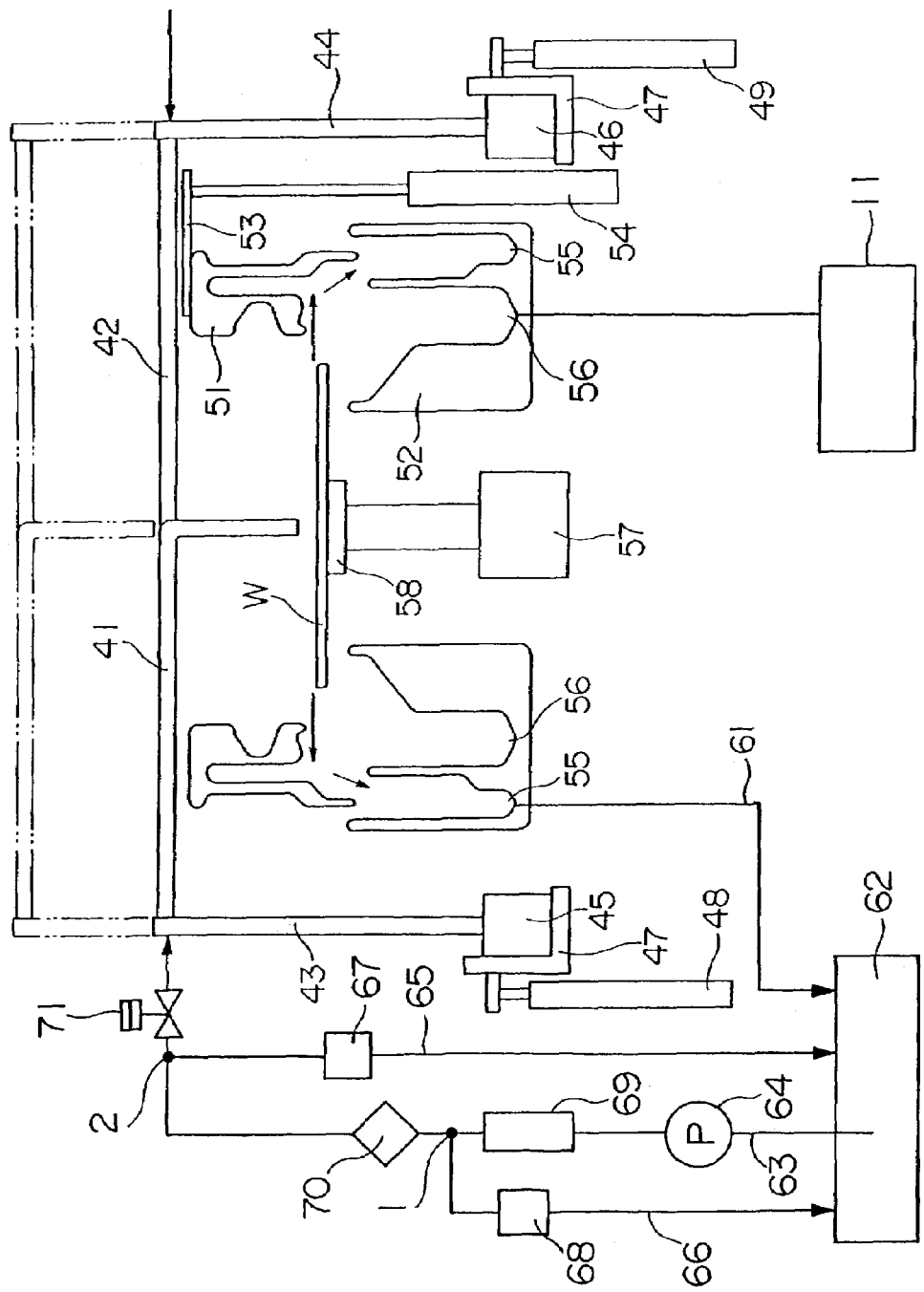
FIG. 3 is yet another schematic side view of the substrate treating apparatus.

FIGS. 1 through 3 are schematic side views of the substrate treating apparatus, respectively.

This substrate treating apparatus includes a spin chuck 58 driven by a motor 57 to rotate with a wafer W having a primary surface thereof in horizontal posture, a first nozzle 41 for supplying the removal liquid to the wafer W held by the spin chuck 58, a second nozzle 42 for supplying deionized water to the wafer W held by the spin chuck 58, and an annular, vertically movable cup 51 and an annular fixed cup 52 acting as a scatter preventive cup for capturing the removal liquid and deionized water scattering from the wafer W in time of wafer treatment.

The first nozzle 41 is connected at a proximal end thereof to a support shaft 43 rotatably supported by a motor 45. The motor 45 is connected to an air cylinder 48 through a bracket 47. Thus, the first nozzle 41 is driven by the air cylinder 48 to move vertically between a removal liquid supplying position shown in solid lines in FIGS. 1 through 3, and a raised position shown in two-dot chain lines in FIGS. 1 through 3. Further, the first nozzle 41 is driven by the motor 45 to swing a distal end thereof between a position opposed to the center of wafer W held by the spin chuck 58, a position opposed to the vicinity of an edge of wafer W held by the spin chuck 58, and a position outside the movable cup 51 and fixed cup 52.

The first nozzle 41 is connected to a removal liquid reservoir 62 through a removal liquid circulating and heating mechanism for circulating and heating the removal liquid.

The removal liquid circulating and heating mechanism includes a common supply line 63 extending between the removal liquid reservoir 62 and first nozzle 41, a first circulating line 66 branching from a first branch point 1 on the common supply line and extending to the removal liquid reservoir 62, and a second circulating line 65 branching from a second branch point 2 on the common supply line between the first branch point 1 and first nozzle 41 and extending to the removal liquid reservoir 62. The common supply line 63 has, arranged between the removal liquid reservoir 62 and first branch point 1, a circulating pump 64 in the form of a bellows pump, for example, and a removal liquid heating unit 69 with a heater for heating the removal liquid. The first circulating line 66 has a flow control valve 68 such as a flowmeter with a needle. The common supply line 63 has a filter 70 disposed between the first branch point 1 and second branch point 2 for filtering the removal liquid flowing between the two branch points 1 and 2. The second circulating line 65 has a flow control valve 67 similar to the flow control valve 68. An electromagnetic switch valve 71 is disposed between the second branch point 2 and first nozzle 41.

The electromagnetic switch valve 71 is normally closed. In this state, the removal liquid in the removal liquid reservoir 62, by the action of circulating pump 64, circulates through the common circulation line 63 and through both the first circulating line 66 and second circulating line 65. That is, the removal liquid that circulates through the common circulation line 63 and first circulating line 66, by the action of circulating pump 64, passes through the removal liquid heating unit 69 to be heated, and flows through the flow control valve 68 to be collected in the removal liquid reservoir 62. The removal liquid that circulates through the common circulation line 63 and second circulating line 65, by the action of circulation pump 64, passes through the removal liquid heating unit 69 to be heated, and after being filtered by the filter 70, flows through the flow control valve 67 to be collected in the removal liquid reservoir 62.

The electromagnetic switch valve 71 is opened when supplying the removal liquid. In this state, the removal liquid that circulates through the second circulating line 65 is transmitted to the first nozzle 41 through the electromagnetic switch valve 71 to be supplied to the surface of wafer W held and rotated by the spin chuck 58. The removal liquid feed rate per unit time is adjusted by the flow control valves 67 and 68.

That is, the quantity of the removal liquid circulating through the first circulating line 66 and the quantity of the removal liquid circulating through the second circulating line 65 are adjusted by the flow control valves 67 and 68. At this time, the quantity of the removal liquid circulating through the first circulating line 66 is set to an appropriate flow rate for maintaining the removal liquid at a proper temperature. The quantity of the removal liquid circulating through the second circulating line 65 is set to such a flow rate that the removal liquid is supplied at a desired rate per unit time from the first nozzle 41 to the surface of wafer W.

The removal liquid supplied from the first nozzle 41 to the wafer W may be an organic amine-based removal liquid containing an organic amine such as dimethyl sulfoxide or dimethylformamide, a removal liquid containing ammonium fluoride, or an inorganic removal liquid.

Specifically, the organic amine-based removal liquid may be a mixed solution of monoethanolamine, water and aromatic triol, a mixed solution of 2-(2-aminoethoxy)ethanol, hydroxyamine and catechol, a mixed solution of alkanolamine, water, dialkylsulfoxide, hydroxyamine and an amine-based anticorrosive, a mixed solution of alkanolamine, glycol ether and water, a mixed solution of dimethylsulfoxide, hydroxyamine, triethylene-tetramine, pyrocatechol and water, a mixed solution of water, hydroxyamine and pyrogallol, a mixed solution of 2-amino-ethanol, ether and sugar alcohol, or a mixed solution of 2-(2-aminoethoxy)ethanol, N, N-dimethylacetamide, water and triethanolamine.

The solution containing an ammonium fluoride substance (called an ammonium fluoride removal liquid) may be a mixed solution of an organic alkali, sugar alcohol and water, a mixed solution of a fluorine compound, an organic carboxylic acid and an acid/amide-based solvent, a mixed solution of alkylamide, water and ammonium fluoride, a mixed solution of dimethylsulfoxide, 2-aminoethanol, an aqueous solution of an organic alkali and aromatic hydrocarbon, a mixed solution of dimethylsulfoxide, ammonium fluoride and water, a mixed solution of ammonium fluoride, triethanolamine, pentamethyldiethylene triamine, iminodiacetate and water, a mixed solution of glycol, alkyl sulfate, organic salt, organic acid and inorganic salt, or a mixed solution of amide, organic salt, organic acid and inorganic salt.

An inorganic solution (or inorganic removal liquid) may be a mixed solution of water and a phosphoric acid derivative.

The second nozzle 42 is connected at a proximal end thereof to a support shaft 44 rotatably supported by a motor 46. The motor 46 is connected to an air cylinder 49 through the bracket 47. Thus, the second nozzle 42 is driven by the air cylinder 49 to move vertically between a deionized water supplying position shown in solid lines in FIGS. 1 through 3, and a raised shown in two-dot chain lines in FIGS. 1 through 3. Further, the second nozzle 42 is driven by the motor 46 to swing a distal end thereof between a position opposed to the center of wafer W held by the spin chuck 58, a position opposed to the vicinity of an edge of wafer W held by the spin chuck 58, and a position outside the movable cup 51 and fixed cup 52.

The second nozzle 42 is connected by piping to a deionized water source not shown. Deionized water fed from the deionized water source is supplied from the second nozzle 42 to the surface of wafer W held by the spin chuck 58.

The vertically movable cup 51 is connected to an air cylinder 54 through a support 53. Thus, the movable cup 51 is driven by the air cylinder 54 to move vertically between a position shown in FIG. 1 for allowing loading and unloading of the wafer W, a deionized water collecting position shown in FIG. 2, and a removal liquid collecting position shown in FIG. 3.

When the movable cup 51 is in the position shown in FIG. 1, a transport mechanism not shown may transport the wafer W into or out of the substrate treating apparatus. In the deionized water collecting position shown in FIG. 2, the movable cup 51 captures the deionized water scattering from the wafer W when the deionized water is supplied to the wafer W for treatment of the wafer W. In the removal liquid collecting position shown in FIG. 3, the movable cup 51 captures the removal liquid scattering from the wafer W when the removal liquid is supplied to the wafer W for treatment of the wafer W.

The fixed cup 52 has a first recess 55 formed circumferentially, and a second recess 56 formed circumferentially and inwardly of the first recess 55. The first recess 55 is used for collecting the removal liquid captured by the movable cup 51 in the removal liquid collecting position shown in FIG. 3. The second recess 56 is used for collecting the deionized water captured by the movable cup 51 in the deionized water collecting position shown in FIG. 2.

The first recess 55 is connected to the removal liquid reservoir 62 through piping 61. The removal liquid collected in the first recess 55 is once stored in the removal liquid reservoir 62, and thereafter transmitted by the action of circulating pump 64 to the first nozzle 41 again to be supplied to the surface of wafer W held by the spin chuck 58. The second recess 56 is connected to a deionized water collector 11. The deionized water collected in the collector 11 is discarded.

Figure 4:
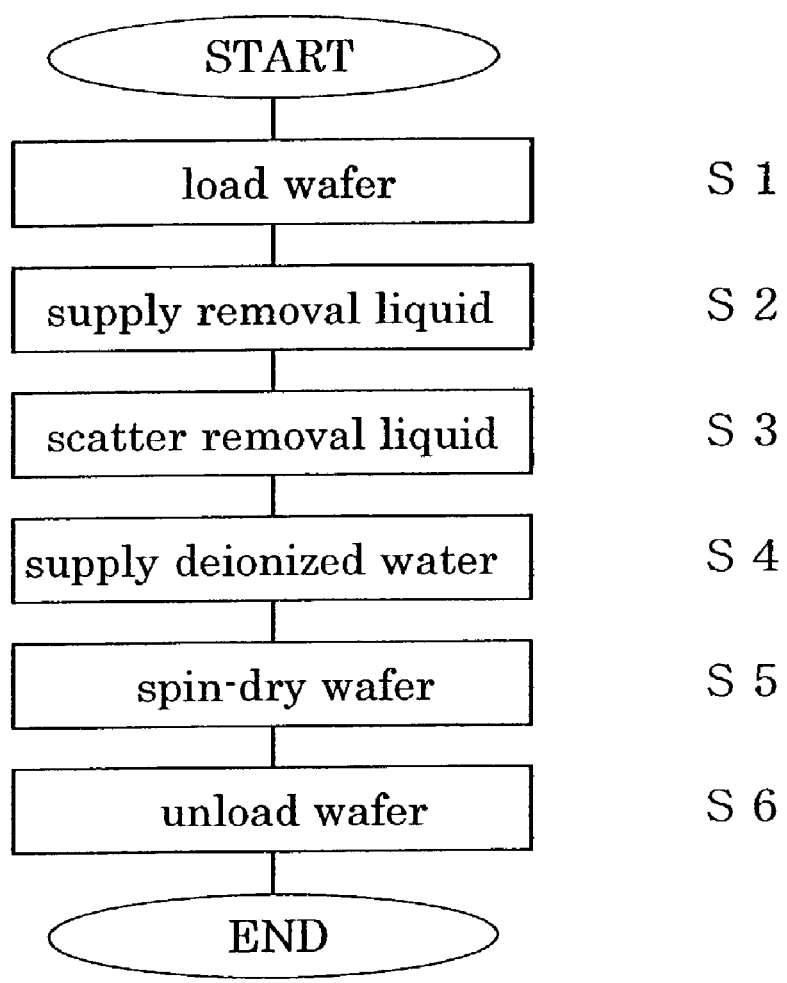
FIG. 4 is a flow chart showing a substrate treating operation of the substrate treating apparatus.

Next, an operation of this substrate treating apparatus for treating a wafer W will be described. FIG. 4 is a flow chart showing the treating operation of the substrate treating apparatus.

First, a wafer W to be treated is loaded into the substrate treating apparatus (Step S1). For loading the wafer W into the apparatus, the movable cup 51 is lowered to the position shown in FIG. 1 for allowing loading and unloading of the wafer W. The distal ends of the first nozzle 41 and second nozzle 42 are kept outside the movable cup 51 and fixed cup 52.

After the transport mechanism places the wafer W on the spin chuck 58, the removal liquid is supplied to the wafer W in the following manner (Step S2).

In time of supplying the removal liquid, the movable cup 51 is raised to the removal liquid collecting position as shown in FIG. 3. Thereafter, the air cylinder 48 is operated to raise the first nozzle 41 once to the upper position shown in two-dot chain lines in FIG. 3, and then the motor 45 is operated to rotate the support shaft 43, thereby moving the distal end of first nozzle 41 from the position outside the movable cup 51 and fixed cup 52 to the position opposed to the center of the wafer W held by the spin chuck 58. Next, the air cylinder 48 is operated to lower the first nozzle 41 to the removal liquid supplying position shown in solid lines in FIG. 3.

In this state, the motor 57 is operated to spin the spin chuck 58, and the electromagnetic switch valve 71 is opened to supply the removal liquid to the surface of the spinning wafer W held by the spin chuck 58. In this way, a process is carried out for removing the reaction product. In time of this removing process, the supply per unit time of the removal liquid from the first nozzle 41 to the surface of wafer W and the rotational frequency of spin chuck 58 are controlled to be predetermined values.

That is, in this removing step, the reaction product may be removed with high efficiency by supplying the removal liquid at a rate of 50 ml or more per minute.

As noted hereinbefore, even when the removal liquid is heated to a proper temperature to realize a maximum rate of removing the reaction product, the removal liquid actually supplied to the wafer W loses some of its heat to the wafer W. This results in a phenomenon of lowering the efficiency of removing the reaction product. When the removal liquid is continuously supplied to the wafer W at 50 ml or more, the wafer W is heated by the removal liquid to restrain the removal liquid cooling down from the proper temperature. This effectively avoids the phenomenon of lowering the efficiency of removing the reaction product and impairing the quality of treatment of the wafer W.

Where the wafer W is the 8-inch type, it is desirable to supply the removal liquid at a rate of 150 ml to 500 ml per minute to the wafer W. Where the wafer W is the 12-inch type, it is desirable to supply the removal liquid at a rate of 200 ml to 1,000 ml per minute to the wafer W. By setting the removal liquid supplying rate per unit time of the removal liquid to such values, the reaction product may be removed from the wafer W with increased efficiency.

The wafer W described in this specification is a substantially circular semiconductor wafer. The wafer W of the 8-inch type is a 200 mm wafer specified by SEMI INTERNATIONAL STANDARDS. The wafer W of the 12-inch type is a 300 mm wafer specified by SEMI INTERNATIONAL STANDARDS. According to the dimensions provided by SEMI INTERNATIONAL STANDARDS, the wafer W of the 8-inch type is 200 mm±0.2 mm, and the wafer W of the 12-inch type 300 mm±0.5 mm.

In the removing step, the reaction product may be removed with high efficiency by setting the rotational frequency of spin chuck 58 to a first speed of at least 100 rpm.

When the rotational frequency of spin chuck 58 is lower than the above value, the removal liquid supplied to the wafer W does not spread quickly over the entire surface of wafer W. Consequently, the wafer W spinning with the spin chuck 58 is lower in temperature adjacent the edge than adjacent the center of rotation. This causes a phenomenon of the temperature of the removal liquid lowering below the proper temperature adjacent the edge of the wafer W, to lower the efficiency of removing the reaction product decreases. This inconvenience may be avoided by setting the rotational frequency of spin chuck 58 to 100 rpm or higher.

It is desirable that the rotational frequency of spin chuck 58 at this time does not exceed 3,000 rpm.

When the rotational frequency of spin chuck 58 exceeds the above value, the removal liquid scattering from the edge of the spinning wafer W could rebound from the movable cup 51 back to the surface of wafer W. Since the removal liquid scattering from the edge of wafer W has a reduced temperature, this removal liquid could lower the temperature of the removal liquid supplied from the first nozzle 41 to the surface of wafer W, to lower the efficiency of removing the reaction product. Further, contaminants could mix into the removal liquid scattering from the edge of wafer W and rebounding from the movable cup 51, to affect the results of treatment of the wafer W. Such an inconvenience may be avoided by setting the rotational frequency of spin chuck 58 to 3,000 rpm or less.

The rotational frequency of spin chuck 58 noted above is controlled by controlling the rotational frequency of motor 58 acting as the driving device for spinning the spin chuck 58.

After completing the removal liquid supplying step under the above conditions, a removal liquid scattering step is executed next (Step S3).

In this scattering step, the spin chuck 58 is spun at a second speed faster than the above first speed to scatter the removal liquid from the wafer W. The removal liquid scattering from the edge of the wafer W is captured by the lower end of vertically movable cup 51 as indicated by arrows in FIG. 3, and collected in the removal liquid reservoir 62 through the first recess 55 in the fixed cup 52. In this way, reuse may be made of the expensive removal liquid. Upon completion of the process of removing the reaction product by using the removal liquid, the distal end of first nozzle 41 is moved outside the movable cup 51 and fixed cup 52.

In the removal liquid scattering step also, the rotational frequency of spin chuck 58, preferably, is 3,000 rpm or less.

Next, a deionized water supplying step is executed (Step S4).

For executing the deionized water supplying step, the movable cup 51 is lowered to the deionized water collecting position shown in FIG. 2. The air cylinder 49 is operated to raise the second nozzle 42 once to the upper position shown in two-dot chain lines in FIG. 2, and then the motor 46 is operated to rotate the support shaft 44, thereby moving the distal end of second nozzle 42 from the position outside the movable cup 51 and fixed cup 52 to the position opposed to the center of the wafer W held by the spin chuck 58. Next, the air cylinder 49 is operated to lower the second nozzle 42 to the deionized water supplying position shown in solid lines in FIG. 2.

In this state, the wafer W is spun with the spin chuck 58, and the deionized water is supplied from the second nozzle 42 to the surface of wafer W to clean the wafer W.

At this time, the deionized water scattering from the edge of the wafer W is captured by the side wall of movable cup 51 as indicated by arrows in FIG. 2, and collected in the deionized water collector 11 through the second recess 56 in the fixed cup 52.

After the cleaning process using the deionized water, a spin-drying step is executed (Step S5). In the spin-drying step, the spin chuck 58 is spun at high speed to spin-dry the wafer W.

Finally, a wafer unloading step is executed (Step S6). For executing the wafer unloading step, the distal end of the second nozzle 42 is moved outside the movable cup 51 and fixed cup 52. The movable cup 51 is lowered to the position for allowing loading and unloading of the wafer W. Then, the transport mechanism, not shown, unloads the wafer W from the spin chuck 58.

The above embodiment discloses a process for removing a polymer, which is a reaction product generated during dry etching, from the wafer having undergone the dry etching. However, the invention is not limited to the removal from the wafer of a reaction product generated during dry etching.

For example, the invention is applicable also to removal from the wafer of a reaction product generated during plasma ashing.

When an impurity diffusion process is carried out with a resist film acting as a mask, the whole or part of the resist film changes into a reaction product. The invention includes the case of removing such reaction product also.

Thus, the invention is applicable also to removal from substrates of reaction products resulting from resists during various processes not limited to dry etching.

Further, the invention is not limited to removal of the resist-originated reaction product from the substrate, but includes also a case of removing the resist itself from the substrate.

For example, a resist may be applied to a substrate to form a resist film thereon, a pattern (e.g. a wiring pattern) is exposed on the resist film, and the exposed resist film is developed. The pattern defined by the developed resist film may be used as a mask to perform a lower film process on a film (which is called a lower film) present under the resist. The invention is applicable also to removal of the resist film no longer necessary after the lower film process.

More particularly, for example, the lower film may be etched after development of the resist film. Whether the etching process is wet etching or dry etching such as RIE, the resist film becomes unnecessary and should be removed after the etching process. The invention includes also such resist removal following the etching process.

Further, in a different case of removing a resist itself from a substrate, an impurity diffusion process may be conducted as a lower film process after the resist film is developed. The resist film becomes unnecessary and should be removed after the diffusion process. The invention includes also such resist removal.

In these cases, any reaction product resulting from a change in property of the resist film may be removed together with the unwanted resist film. This is advantageous in improving throughput and reducing cost.

When, for example, the lower film is dry-etched in the above etching process, a resist-originated reaction product is also generated. As a result, the resist film itself serving as a mask for the lower film during the dry etching and the reaction product resulting from a change in property of the resist film may be removed at the same time.

A resist-originated reaction product is generated also when the impurity diffusion process (e.g. ion implantation) is conducted on the lower film. Consequently, the resist film itself serving as a mask for the lower film during the impurity diffusion process and the reaction product resulting from a change in property of the resist film may be removed at the same time.

Furthermore, according to the invention, it is possible to remove not only the resist-originated reaction product and the resist itself, but also organic matter not originating from the resist, such as minute contaminants emanating from the human body.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for removing an organic substrate from a substrate by using a removal liquid capable of removing organic substances, said apparatus comprising:
    substrate support means for supporting the substrate to be rotatable in a plane including a principal surface of the substrate;
    drive means being controlled to rotate said substrate support means at a rotational frequency of at least 100 rpm;
    removal liquid supply means being controlled to supply the removal liquid at a rate of at least 50 ml per minute to the substrate while the substrate is supported and rotated at said at least 100 rpm_by said substrate support means; and
    removal liquid heating means for heating the removal liquid to be supplied to the substrate by said removal liquid supply means;
    whereby, due to said rotational frequency and said supply rate, the substrate is sufficiently heated by the heated removal liquid so that the removal liquid does not substantially cool while on the substrate;
    said removal liquid heating means comprising a circulating and heating mechanism for heating the removal liquid up to a temperature range of 50 to 80 degrees centigrade while circulating the removal liquid;
    flow control means in said circulating and heating mechanism;
    wherein said removal liquid circulating and heating mechanism includes a common supply line extending between a removal liquid reservoir and a nozzle, a first circulation line branching from a first branch point on the common supply line and extending to the removal liquid reservoir, and a second circulation line branching from a second branch point on the common supply line and extending to the removal liquid reservoir;
    wherein the removal liquid supply means supplies the removal liquid to the substrate while circulating the removal liquid in the first and second circulation lines.

2. A substrate treating apparatus as defined in claim 1, further comprising a scatter preventive cup surrounding the substrate supported and rotated by said substrate support means, for preventing scattering of the removal liquid, wherein said drive means rotates the substrate at a variable rotational frequency up to and including 3,000 rpm.

3. A substrate treating apparatus as defined in claim 1, wherein said organic substance is a reaction product resulting from a change in property of resist.

4. A substrate treating apparatus as defined in claim 3, wherein said reaction product results from a dry etching with a resist film used as a mask.

5. A substrate treating apparatus as defined in claim 4, wherein the substrate supported by said substrate support means is an 8-inch type, and said removal liquid supply means supplies the removal liquid at a rate of 150 ml to 500 ml per minute to the substrate supported by said substrate support means.

6. A substrate treating apparatus as defined in claim 4, wherein the substrate supported by said substrate support means is a 12-inch type, and said removal liquid supply means supplies the removal liquid at a rate of 200 ml to 1,000 ml per minute to the substrate supported by said substrate support means.

7. A substrate treating apparatus as defined in claim 1, wherein the substrate supported by said substrate support means is an 8-inch type, and said removal liquid supply means supplies the removal liquid at a rate of 150 ml to 500 ml per minute to the substrate supported by said substrate support means.

8. A substrate treating apparatus as defined in claim 1, wherein the substrate supported by said substrate support means is a 12-inch type, and said removal liquid supply means supplies the removal liquid at a rate of 200 ml to 1,000 ml per minute to the substrate supported by said substrate support means.

9. A substrate treating apparatus as defined in claim 1, wherein said removal liquid supply means includes a switch valve disposed between one of said circulation lines and the nozzle; and
    wherein the nozzle and switch valve are connected to the second circulation line.

10. A substrate treating apparatus as defined in claim 1, wherein said flow control means includes a flow control valve provided in at least one of the first and second circulation lines.

11. A substrate treating apparatus as defined in claim 1, wherein said flow control means include a respective flow control valve provided in each of the first and second circulation lines.

12. A substrate treating apparatus as defined in claim 1, wherein said circulating and heating mechanism further includes a common circulation line including a pump and a heater, said first and second circulation lines both branching off said common circulation line for circulating removal liquid from said common line.

13. A substrate treating apparatus as defined in claim 12, wherein said first circulation line branches off said common line at a branching point after said pump and said heater.

14. A substrate treating apparatus as defined in claim 13, wherein said second circulation line branches off said common line at a branching point after said pump and said heater.

15. A substrate treating apparatus as defined in claim 1, wherein said first and second circulation lines are each equipped with a respective flow control means.

16. A substrate treating apparatus for removing an organic substrate from a substrate by using a removal liquid capable of removing organic substances, said apparatus comprising:
   substrate support means for supporting the substrate to be rotatable in a plane including a principal surface of the substrate;
   drive means being controlled to rotate said substrate support means at a rotational frequency of at least 100 rpm;
   removal liquid supply means being controlled to supply the removal liquid at a rate of at least 50 ml per minute to the substrate while the substrate is supported and rotated at said at least 100 rpm by said substrate support means; and
   removal liquid heating means for heating the removal liquid to be supplied to the substrate by said removal liquid supply means;
   whereby, due to said rotational frequency and said supply rate, the substrate is sufficiently heated by the heated removal liquid so that the removal liquid does not substantially cool while on the substrate;
   said removal liquid heating means comprising a circulating and heating mechanism for heating the removal liquid up to a temperature range of 50 to 80 degrees centigrade while circulating the removal liquid;
   flow control means in said circulating and heating mechanism;
   wherein said circulating and heating mechanism includes first and second circulation lines, each being equipped with a respective flow control means;
   wherein the removal liquid supply means supplies the removal liquid to the substrate while circulating the removal liquid in the first and second circulation lines;
   wherein said circulating and heating mechanism further includes a reservoir and a common circulation line including a pump and a heater, said first and second circulation lines both branching off said common circulation line for circulating removal liquid from said common line back to said reservoir;
   wherein said first circulation line branches off said common line at a branching point after said pump and said heater;
   wherein said second circulation line branches off said common line at a branching point after said pump and said heater; and
   wherein said common line further includes a filter, wherein said first circulation line branches off said common line at a branching point after said pump and said heater and before said filter; and said second circulation line branches off said common line at a branching point after said pump and said heater and after said filter.

17. A substrate treating apparatus as defined in claim 16, wherein said removal liquid supply means includes a switch valve disposed between the second circulation line and the nozzle.

* * * * *